United States Patent [19]

Tano

[11] Patent Number: 4,597,719
[45] Date of Patent: Jul. 1, 1986

[54] SUCK-BACK PUMP

[75] Inventor: Terukuni Tano, Tokyo, Japan

[73] Assignees: Canon Kabushiki Kaisha; Canon Hanbai Kabushiki Kaisha, both of Tokyo, Japan

[21] Appl. No.: 593,704

[22] Filed: Mar. 26, 1984

[30] Foreign Application Priority Data

Mar. 28, 1983 [JP] Japan .................................. 58-50506

[51] Int. Cl.⁴ .............................................. F04B 9/00
[52] U.S. Cl. .................................... 417/317; 222/571; 251/63; 251/63.6; 417/85
[58] Field of Search ............... 417/317, 440, 572, 274, 417/85, 401; 222/575, 571, 544; 251/63, 63.6, 335 A; 91/443

[56] References Cited

U.S. PATENT DOCUMENTS

| | | | |
|---|---|---|---|
| 862,867 | 8/1907 | Eggleston | 417/390 |
| 3,895,748 | 7/1975 | Klingenberg | 222/571 |
| 4,139,333 | 2/1979 | Sipos | 417/430 X |
| 4,142,707 | 3/1979 | Bjorklund | 222/571 X |
| 4,253,379 | 3/1981 | Olson | 91/443 X |
| 4,422,835 | 12/1983 | McKee | 417/401 |
| 4,452,573 | 6/1984 | Samuel | 417/401 |

Primary Examiner—Edward K. Look
Attorney, Agent, or Firm—Fitzpatrick, Cella, Harper & Scinto

[57] ABSTRACT

A suck-back pump for preventing any additional amount of liquid from dropping out of the tip of a delivery pipe, after a predetermined amount of liquid has been delivered from the delivery pipe. The suck-back pump includes inlet and outlet ports for liquid, first and second chamber respectively connected with the inlet and outlet ports, a communicating passage for connecting the first and second chambers with each other, a shut-off valve movable to close the communicating passage, and a suction element movable to change the volume of the second chamber. The actuation of the suction element is retarded so that it is actuated after the shut-off valve has been actuated.

7 Claims, 2 Drawing Figures

SUCK-BACK PUMP

BACKGROUND OF THE INVENTION

1. Field of the Invention

The present invention relates to a suck-back pump used to prevent extra drops from falling from the tip of pipe of the like after a constant amount of liquid has been discharge therefrom.

2. Description of Prior Art

Discharge of liquid of a predetermined accurate amount is required in various arts. It is one the important factors to be considered that any drops must be prevented from being discharged, after the liquid has been discharged in the predetermined amount. For example, in photolithography utilized to form a fine pattern on the surface of a silicon wafer in manufacturing an integrated circuit, the wafer surface must be uniformly coated with photoresist. The coating is normally attained by dropping a predetermined amount of photoresist in the form of drops on the wafer and then rotating the wafer to spread the photoresist uniformly thereover under centrifugal force. In such a process, if any excessive amount of photoresist is dropped on the wafer surface, a coated film would be irregular in thickness resulting in unwanted troubles during any subsequent process.

To prevent the above problem, a method has been used in which some suction is created within the liquid delivery passage to draw an excessive photoresist from the delivery nozzle. Such a suction has been accomplished by at first pressing an elastomeric tube such as a Teflon tube in the diametrical direction during feeding of amount of photoresist out of the tube and then releasing the tube to return its initial form to create a suction, or by providing a bellows type pump in the delivery passageway for drawing the excessive liquid into the interior of the tube. In either of these piror art means, however, there is a remarkable degradation. If the elastomeric tube is subjected to repeated deformations, the deformed portion of the tube would deteriorate early. Also in the bellows type pump, its degradation cannot be avoided at the bellows portion which is subjected to larger deformation. Even if the bellows is made of stainless steel, a satisfactory durability would not be expected.

SUMMARY OF THE INVENTION

In view of the above disadvantages of the prior art, it is therefore an object of the present invention to provide a suck-back pump which can positively prevent any additional drops from falling out of a pipe after a predetermined amount of liquid has been fed out of the pipe and yet which has a good durability.

The present invention provides a suck-back pump which comprises two alternately actuating valves between inlet and outlet ports for liquid, i.e., a shut-off valve for blocking the path of liquid and a suction element for drawing the liquid from the outlet port into the path. In a preferred form, the above shut-off valve has a function of feeding a constant amount of liquid out of the path.

DESCRIPTION OF PREFERRED EMBODIMENTS

Figure 1:
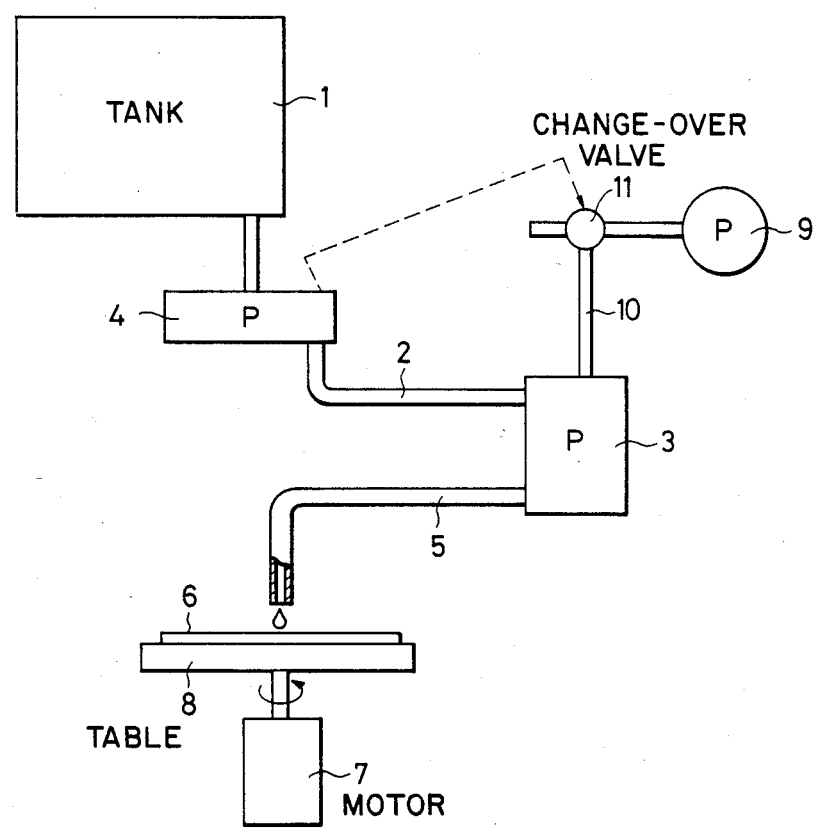
FIG. 1 is a schematic view of a photoresist coater utilizing a suck-back pump according to the present invention.

FIG. 1 shows a photoresist coater according to the present invention. The coater comprises a tank 1 in which photoresist is contained and which is connected with a suck-back pump 3 through a pipe 2. This pipe 2 is connected with a metering and delivering pump 4 which serves to intermittently feed a constant amount of photoresist to the suck-back pump 3. The photoresist is supplied to the inlet port of the suck-back pump 3 through the pipe 2 and then moves to the outlet port of the suck-back pump 3 therethrough. The outlet of the suck-back pump 3 is connected with a pipe 5 from the tip end of which a predetermined amount of photoresist is dropped onto a wafer 6. The wafer 6 is placed on a table 8 which can be rotated by a motor 7. Upon rotation of the table, the dropped photoresist is spread over the wafer surface into a uniform thickness under the action of centrifugal force.

The suck-back pump 3 is adapted to suck back a part of the photoresist remaining within the pipe 5 after the constant amount of photoresist has been dropped onto the wafer surface, in order to prevent any excessive drop of the photoresist from falling from the tip end of the pipe 5 onto the wafer 6. With this drawing action, the liquid surface expanded out of the tip end of the pipe 5 is retracted into the pipe so that excessive drop is prevented from falling.

As shown in more detail in FIG. 1, the suck-back pump 3 may be of pneumatically actuated type and comprises an air pump 9 for creating pressurized air, a pipe 10 for supplying the pressurized air to the suck-back pump 3, and a change-over valve 11 provided in the midpoint of the pipe 10. The change-over valve 11 is operably associated with the metering and delivering pump 4 and adapted to transfer the pressurized air from the air pump 9 to suck-back pump 3 and also to release the pressurized air within the suck-back pump 3 to atmosphere.

Figure 2:
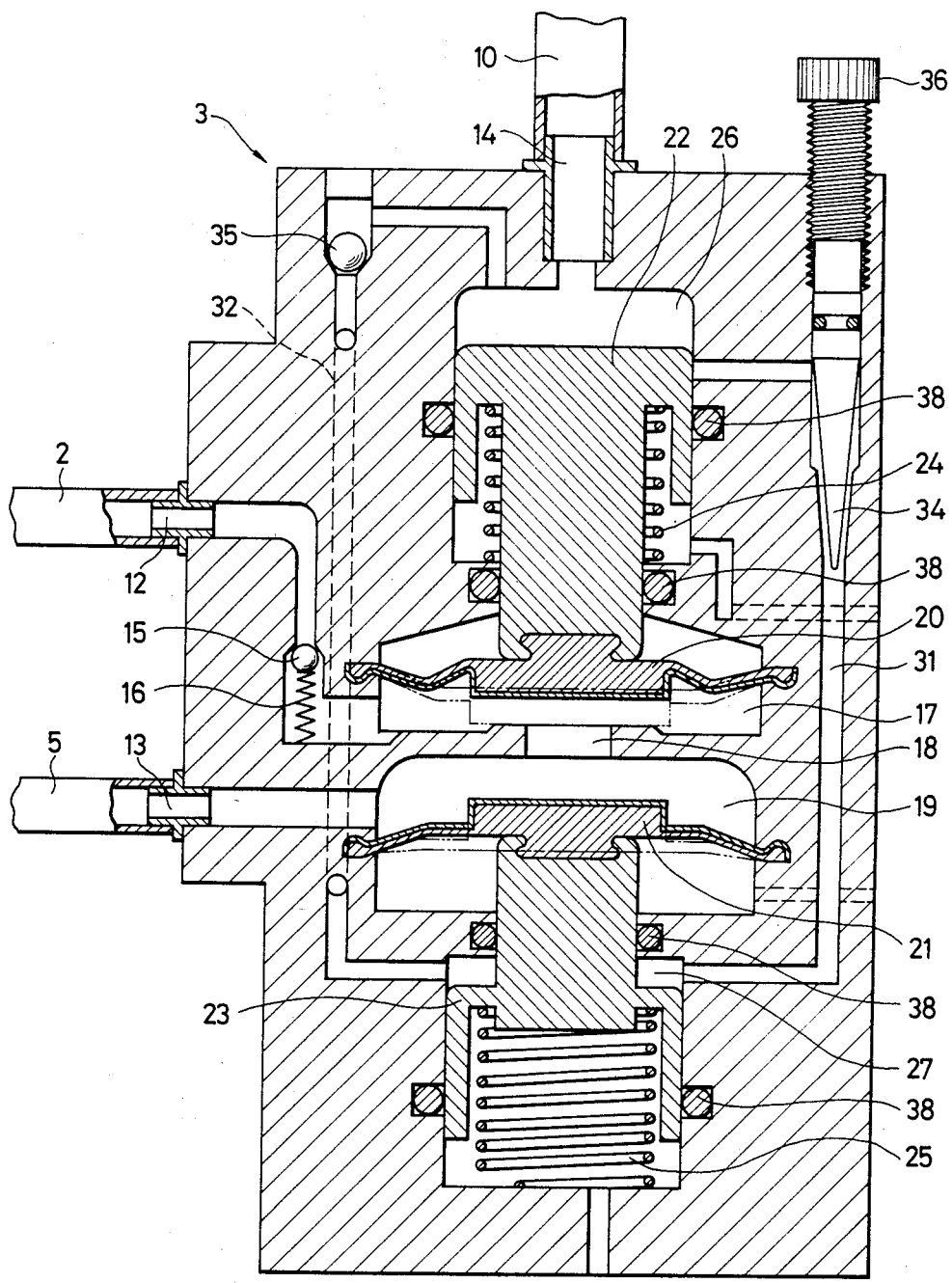
FIG. 2 is a sectional view of a suck-back pump according to the present invention.

FIG. 2 shows a preferred form of the suck-back pump according to the present invention. The suck-back pump 3 comprises an inlet port 12 connected to the pipe 2, an outlet port 13 connected with the pipe 5 and an air inlet 14 connected with the pipe 10. The photoresist delivered to the suck-back pump 3 through the inlet port 12 thereof moves in to a first chamber 17 through a check valve which consists of a ball 15 and a spring 16. The first chamber 17 communicates with a second chamber 19 through a communicating passage 18. Thus, the photoresist is once received by the second chamber 19 and then discharged out through the outlet port 13.

A shut-off valve 20 is disposed within the first chamber 17 and has openings formed therein at the flexible margin. The shut-off valve 20 is movable downwardly to close the communicating passage 18. On the other hand, a suction element 21 is disposed within the second chamber 19 as a partition therewithin. The suction element 21 has its circumferential edge sealingly secured to the wall defining the second chamber 19. When the suction element 21 is moved, the volume of the partitioned chamber changes. The valves 20 and element 21 may be made of SUS stainless steel, rubber and other materials. Each of the valves 20 and element 21 is operably connected with a pneumatically actuated piston 22 and 23 respectively. Each piston 22 and 23 is biased to its initial position shown in FIG. 2, by means of a spring 24 and 25 respectively.

Each piston 22 and 23 is slidably received within a cylinder 26 and 27 respectively to which the pressurized air is supplied from the air pump 9 shown in FIG. 1. The air passageway used to supply the pressurized air for the reciprocation of the pistons within the respective cylinders includes flow passages 31 and 32 which connect the cylinders 26 and 27 with each other. The flow passage 31 includes a needle valve 34 located therein, while the flow passage 32 includes a ball valve 35 positioned therein. The needle valve 34 is movable within and along the flow passage 31 by turning a knob 36.

In order to facilitate the movement of the shut-off element 20, suction valve 21 and pistons 22 and 23, the cylinders 26 and 27 and the second chamber 19 are provided with air vents. Furthermore, sealing O-rings 38 are provided at appropriate locations pertaining to the strokes of the pistons 22 and 23.

The operation of the above suck-back pump is as follows: First of all, the pistons 22 and 23 are in their initial positions shown by solid lines in FIG. 2. Now suppose that the pipes 2, 5 and chamber 17, 19 are filled with the photoresist. Immediately after a predetermined amount of photoresists has been delivered by the metering and delivering pump 4, the pressurized air is supplied from the air pump 9 to the cylinder 26. The pressurized air moves the piston 22 downwardly against the bias of the spring 24, such that the shut-off valve 20 will downwardly be moved to its lower position shown by broken line in FIG. 2 to close the cummunicating passage 18. As described hereinbefore, the shut-off valve 20 has openings formed therein at its flexible margin. Therefore, the photoresist can be released to behind the shut-off valve 20 when it is moved downwardly. As a result, the photoresist will not be urged out of the suck-back pump 3 during the downward movement of the shut-off valve 20.

As the piston 22 is moved downwardly, the air passage 31 is opened to supply the pressurized air to the cylincer 27. Since the needle valve 34 is located within the air passage 31, the piston 23 can be moved at any suitable adjusted speed. The piston 23 and suction element 21 are thus displaced to their positions shown by broken lines in FIG. 2. As a result, the volume of the second chamber 19 is increased such that the photoresist in the pipe 5 will gradually be drawn into the second chamber 19. Thus, any additional photoresist drop after discharge of the predetermined amount can be prevented from falling from the tip of the pipe 5 as described hereinbefore. It is to be noted that the air passage 32 is closed during this stage by means of the ball valve 35, since the pressure operating force in the cylinder 26 is slightly higher than that in the cylinder 27.

Immediately before the metering and delivering pump 4 is again actuated, the change-over valve 11 is actuated to disconnect the pipe 10 from the air pump 9 so that the pipe 10 will be opened to atmosphere. As a result, the pressurized air is released from the cylinder 26 to atmosphere such that the upper piston 22 therein will rapidly be returned to its initial position under the biasing force of the spring 24. On the other hand, the pressurized air within the lower cylinder 27 will move toward the ball valve 35 through the passage 32 due to the reduction of pressure in the upper cylinder 26. The ball valve 35 is thus opened to admit the pressurized air to the upper cylinder 26. Accordingly, the lower piston 23 also can move upwardly to its initial position together with the upper piston 22. The upward movement of the upper piston 22 opens the shut-off valve 20 while the upward movement of the lower piston 23 returns the suction valve to its initial position.

Although the aforementioned embodiment has been described with the shut-off valve 20 having openings formed therein at the flexible margin, the shut-off valve may be of the same type as the suction element 21 having no opening. In such a case, the photoresist will be urged outwardly through the outlet port 13 upon the downward movement of the shut-off valve 10. Such a construction provides that the shut-off valve also functions as a metering and delivering pump, so that the metering and delivering pump 4 shown in FIG. 1 can be omitted.

In accordance with the present invention, the conventional valve structure using a bellows or the like may be replaced by a diaphragm type valve which is subjected to less deformation, so that the durability and operability are substantially improved. Such a diaphragm type valve can easily be actuated by a piston which can pneumatically or hydraulically driven. Thus, an automatic control can readily be provided in the system. This is particularly effective where a number of repeated operations are required. What I claim is:

1. A suck-back pump for preventing any additional amount of liquid from dropping out of an outlet of a delivery pipe, by drawing the liquid within the delivery pipe, said suck-back pump comprising:
   an inlet port for receiving liquid;
   an outlet port to be placed in communication with said delivery pipe;
   a first chamber communicating with said inlet port;
   a second chamber communicating with said outlet port;
   a flow passage for connecting said first chamber with said second chamber;
   a shut-off valve for opening and closing said flow passage;
   suction means for changing the volume of said second chamber;
   a first piston for moving said shut-off valve;
   a second piston for moving said suction means;
   a first cylinder slidably receiving said shut-off valve moving piston;
   a second cylinder slidably receiving said suction means moving piston;
   a first flow passage for supplying pressurized fluid to said first cylinder for said shut-off valve moving piston to move the piston therein, and
   a second flow passage for connecting said first cylinder for said shut-off valve moving piston with said second cylinder for said suction means moving piston for supplying pressurized fluid from the former to the latter, said second flow passage being constructed to connect said first and second cylinders with each other when said shut-off valve moving piston moves through a predetermined distance.

2. A suck-back pump as defined in claim 1, further comprising a needle valve disposed in said second flow passage for selectively connecting said cylinders.

3. A suck-back pump as defined in claim 1, further comprising means for retarding the actuation of said suction means relative to that of said shut-off valve such that said suction means is actuated after said shut-off valve has been actuated.

4. A suck-back pump as defined in claim 3, further comprising selection means for selectively actuating said retarding means.

5. A suck-back pump as defined in claim 4, wherein said selection means comprises a needle valve located within said second flow passage and the operation of said suction means moving piston is adjusted by adjusting said needle valve to control the flow of the pressurized fluid to be supplied to said second cylinder for said suction means moving piston.

6. A suck-back pump as defined in claim 1, further comprising a third flow passage for connecting said first and second cylinders with each other to discharge the pressurized fluid out of said second cylinder for said suction means moving piston.

7. A suck-back pump as defined in claim 6, further comprising check valve means provided between said first cylinder for said shut-off valve moving piston and said third flow passage for preventing reverse flow of fluid from said first cylinder for said shut-off valve moving piston to said third flow passage.

* * * * *